United States Patent
Baryshnikov et al.

(10) Patent No.: US 9,356,062 B2
(45) Date of Patent: May 31, 2016

(54) OPTOELECTRONIC PHOTODETECTOR (VARIANTS)

(71) Applicants: Aleksandr Nikolaevich Baryshnikov, Moscow (RU); Vladimir Sergeevich Bezobrazov, pos. Novye Rzhavki (RU); Aleksandr Alekseevich Gribach, Zelenograd (RU); Vasiliy Petrovich Ivanov, Moscow (RU); Sergey Petrovich Maksimyak, pos. Kommunarka (RU)

(72) Inventors: Aleksandr Nikolaevich Baryshnikov, Moscow (RU); Vladimir Sergeevich Bezobrazov, pos. Novye Rzhavki (RU); Aleksandr Alekseevich Gribach, Zelenograd (RU); Vasiliy Petrovich Ivanov, Moscow (RU); Sergey Petrovich Maksimyak, pos. Kommunarka (RU)

(*) Notice: Subject to any disclaimer, the term of this patent is extended or adjusted under 35 U.S.C. 154(b) by 0 days.

(21) Appl. No.: 14/413,701

(22) PCT Filed: Nov. 8, 2013

(86) PCT No.: PCT/RU2013/000995
§ 371 (c)(1),
(2) Date: Jan. 9, 2015

(87) PCT Pub. No.: WO2014/081341
PCT Pub. Date: May 30, 2014

(65) Prior Publication Data
US 2015/0187829 A1    Jul. 2, 2015

(51) Int. Cl.
| | |
|---|---|
| *H01L 27/146* | (2006.01) |
| *G01C 11/02* | (2006.01) |
| *G03B 37/04* | (2006.01) |
| *H04N 5/225* | (2006.01) |
| *H04N 5/232* | (2006.01) |
| *H04N 5/247* | (2006.01) |

(52) U.S. Cl.
CPC .......... *H01L 27/14625* (2013.01); *G01C 11/02* (2013.01); *G03B 37/04* (2013.01); *H01L 27/14603* (2013.01); *H04N 5/2258* (2013.01); *H04N 5/23238* (2013.01); *H04N 5/247* (2013.01)

(58) Field of Classification Search
CPC ................ H01L 27/14625; H01L 27/14603; G01C 11/02; G03B 37/04; H04N 5/2258; H04N 5/23238; H04N 5/247
USPC ........................................ 250/208.1
See application file for complete search history.

(56) References Cited

U.S. PATENT DOCUMENTS

| | | | | |
|---|---|---|---|---|
| 7,305,180 | B2 * | 12/2007 | Labaziewicz et al. | H04N 5/225 348/E5.024 |
| 7,339,614 | B2 * | 3/2008 | Gruber et al. | G06T 3/4038 348/144 |
| 2011/0122223 | A1 | 5/2011 | Gruber et al. | |
| 2011/0122300 | A1 | 5/2011 | Gruber et al. | |
| 2012/0082441 | A1 | 4/2012 | Krueger | |

FOREIGN PATENT DOCUMENTS

| | | |
|---|---|---|
| RU | 44838 U1 | 3/2005 |
| WO | WO 2008/075335 A1 | 6/2008 |

* cited by examiner

*Primary Examiner* — Seung C Sohn
(74) *Attorney, Agent, or Firm* — John Alumit

(57) ABSTRACT

A optoelectronic photo sensor to obtain single mosaic digital photographic images. Photo sensor is designed as a plurality of identical lenses having rows of staggered identical matrices arranged on a common focal surface with the gaps between adjacent matrices not exceeding the length of the effective number of pixels oriented along the row. Said arrangement provides a single large survey field from a plurality of individual matrices. Said design contemplates the use of several small individual lenses instead of one large and expensive lens, as well as many small matrices instead of one large and expensive matrix. The lenses are arranged at an angle to each other with a strictly defined dependence on the focal distance and the length of the gap between matrices in the row, which ensures continuous imaging by individual matrices over the surface surveyed with preset overlapping for subsequent cross-linking of images into one single film.

3 Claims, 5 Drawing Sheets

OPTOELECTRONIC PHOTODETECTOR (VARIANTS)

CROSS-REFERENCE TO RELATED APPLICATION

This application is a national stage patent application arising from PCT/RU2013/000995 filed on Nov. 8, 2013, and referenced in WIPO Publication No. WO2014/081341. The earliest priority date claimed is Nov. 22, 2012.

FEDERALLY SPONSORED RESEARCH

None

SEQUENCE LISTING OR PROGRAM

None

BACKGROUND

The present invention relates to digital photographic technology, in particular, to optoelectonic systems (OES), and can be used to obtain mosaic digital photographic images.

Known is an optoelectronic photo sensor, comprising a lens and a digital sensor located in the focal plane of the lens (China patent No. CN 101556758, 2010).

Also known is a digital camera with an optical system and a digital electronic sensor located in the focal plane of the optical system (US Application No. 2012/0082441, 2012).

The disadvantage of the known devices of this type is the small image field obtained due to the sizes of the sensor and the lens.

The closest technical solution to the method of the present invention is an optoelectonic photo sensor for aerial photography comprising an optical system and an electronic photosensitive device located on the focal surface of the system (US Application No. 2011/0122300, 2011).

The abovementioned known classical designs "one lens—one matrix" have limitations that are especially significant for aerial survey systems. The size (and pixel dimensions) of digital photo sensors is technologically and physically limited and practically every existing individual photo sensor has a smaller number of photosensitive elements than any large-format film carrier in classical aerial photography systems. Said disadvantage can be compensated in a monoscopic system by using hybrid sensors based on several photo sensors with outputs located on three, two, or one crystal face (instrument case).

Although fairly capacious hybrid photo sensors are known in the art—8, 192×8, 192 pixels (64 M), size 129×129 mm, Loral Fairchild (USA), a hybrid of 8 matrices with single-side outputs; 8, 192×8, 192 pixels (64 M) size 90×90 mm, Fortune Aerospace (USA), a hybrid of 4 matrices with double-ended outputs—the hybrid approach is not promising for several reasons:

- "mosaic" hybrid matrices with a minimum gap between mosaic elements matching the complicated production process of the matrices themselves are technologically complicated to manufacture;
- it is impossible to obtain resulting capacity of the sensor that would exceed the capacity of the initial matrices more than 4 to 5 times; and
- it takes a long time to read the composite picture (based on a preset reading rate) when using the required initial matrices with a maximum available capacity and to make preparations using the "frame readout" technology (which requires mechanical shutters and a low framing rate, resulting in significant limitation of the carrier speed).

Multiple-lens aerial photography systems that synthesize resulting images (frame) from several simultaneously obtained base images (subframes) are free from the disadvantages inherent in hybrid photo sensors, and from some other limitations common for OESs having a "one lens—one matrix" scheme. The most significant feature of an OES with such a scheme is that each of the lenses forms its own image space (independent of the image spaces of other lenses) that participates in framing in conjunction with a three-dimensional overriding function, which is neither smooth, nor monotonous, nor continuous. Moreover, more problematic with the three-dimensional function that generates a frame from subframes is that each point in each of the base image spaces (or at least in two adjacent base spaces) can correspond to the same point of the native frame spaces. Thus, the subframe's transformation into frames must be described in each particular case with one generating function that refers to the class of piecewise-linear polynomial transformations and rule sets for assigning one or another subframes space (subareas) to a non-overlapping adjacent space (subareas) of the output frame.

Such approach to building photographic equipment is possible only in digital photography, for example, when a picture is recorded onto a plane covered with photo-sensitive material, when integration of several pictures into one frame requires a secondary projection at a minimum, or, in simpler cases, when using image transformers. In addition, photographic correction of the inevitable image distortions caused by the conjugation of several different scale images located in non-parallel focal planes is difficult, if not impossible. Conversely, for digital images, the task of piecewise-linear correction comes down to a calculation of base picture transformation into the initial one using a polynomial model with subsequent formation of a single mosaic image. Concomitantly, with said calculations, some changes can be made to take into account (eliminate) the following:

- the slope of photographing axis to the landscape being depicted (perspective distortions);
- the distortion of lenses used;
- the deviation of real focal distances from the theoretical (scale correction); and
- the relative position of lenses (for multiple-lens scheme).

Application of said approach to the building of systems with several lenses and several matrices located thereunder can yield an optoelectronic system free from all or most of projection type constraints, provided that the complex of transformation functions is defined unambiguously. Thus, the output image can be obtained free from the perspective effect, can be adjusted to the theoretical projection (frame, panoramic, etc.), and can include previously known space-determined distortion presets listed in a table (grid-scale model).

SUMMARY

The technical result of the invention is an increased imaging format of an optoelectronic photo sensor and reduced geometric and chromatic distortions.

Said technical result is achieved by creating an optic system comprising at least two lenses, while the photosensitive electronic device comprises a plurality of individual groups of identical digital photosensitive matrices corresponding to a plurality of lenses with a total number of all the matrices not exceeding the number of lenses. The he matrices of each group are located in a row with gaps not exceeding, in size, the product of the number of effective pixels multiplied by the actual pixel size in one matrix along the symmetry axis thereof, oriented along a row, multiplied by the number of groups minus one. The groups of matrices are located in parallel rows with each on the focal surface of the corresponding lens in such a way that the matrices of one group are displaced with respect to the matrices of another group along the direction of their row to a distance not exceeding the length of the maximum gap between matrices in the row.

The second embodiment comprises an optic system having at least two lenses, while the photosensitive electronic device comprises a plurality of individual groups of the same digital photosensitive matrices corresponding to the plurality of lenses with the total number of all matrices not exceeding the number of lenses. The matrices of each group are located on the focal surface of the corresponding lens in a row with gaps along one axis comprising eponymous symmetry axes of the matrices. The axes of the row of matrices from different groups are located in parallel planes, whereupon projections of optic axes of the lenses form an angle, expressed in radians, and not exceeding the quotient of the distance between adjacent matrices in the row divided by the product of lenses' number multiplied by their focal distance.

The third embodiment has a characteristic condition, wherein the matrices of one group are displaced with respect to the matrices of another group along the direction of their row to a distance not exceeding the length of the maximum gap between the matrices in the row. The axes of the row of matrices from different groups are located in parallel planes whereupon projections of optic axes of the lenses form an angle, which size is inversely proportional to the size of displacement of one group of matrices with respect to another. Said angle is expressed in radians and does not exceed the quotient of the distance between adjacent matrices in a row divided by the product of the number of lenses multiplied by their focal distance. Said distinctive features are essential.

A photo sensor with a plurality of identical lenses and rows of staggered identical matrices, which are located on a shared focal surface with gaps between adjacent matrices not exceeding the length of the effective pixel number, and oriented along a row, creates a single large framing field from many individual matrices. Such design contemplates the use of several small individual lenses instead of one large and expensive lens as well as many small matrices instead of one expensive big matrix.

The features of the second and third embodiments also ensure achieving the technical result.

Arrangement of lenses at an angle to each other and the strictly defined dependence on the focal distance and the length of the gap between matrices in a row ensure continuous imaging by individual matrices over the surveyed surface with preset overlapping for subsequent cross-linking of images into one single film.

DRAWINGS

DESCRIPTION OF PREFERRED EMBODIMENT

Figure 1:
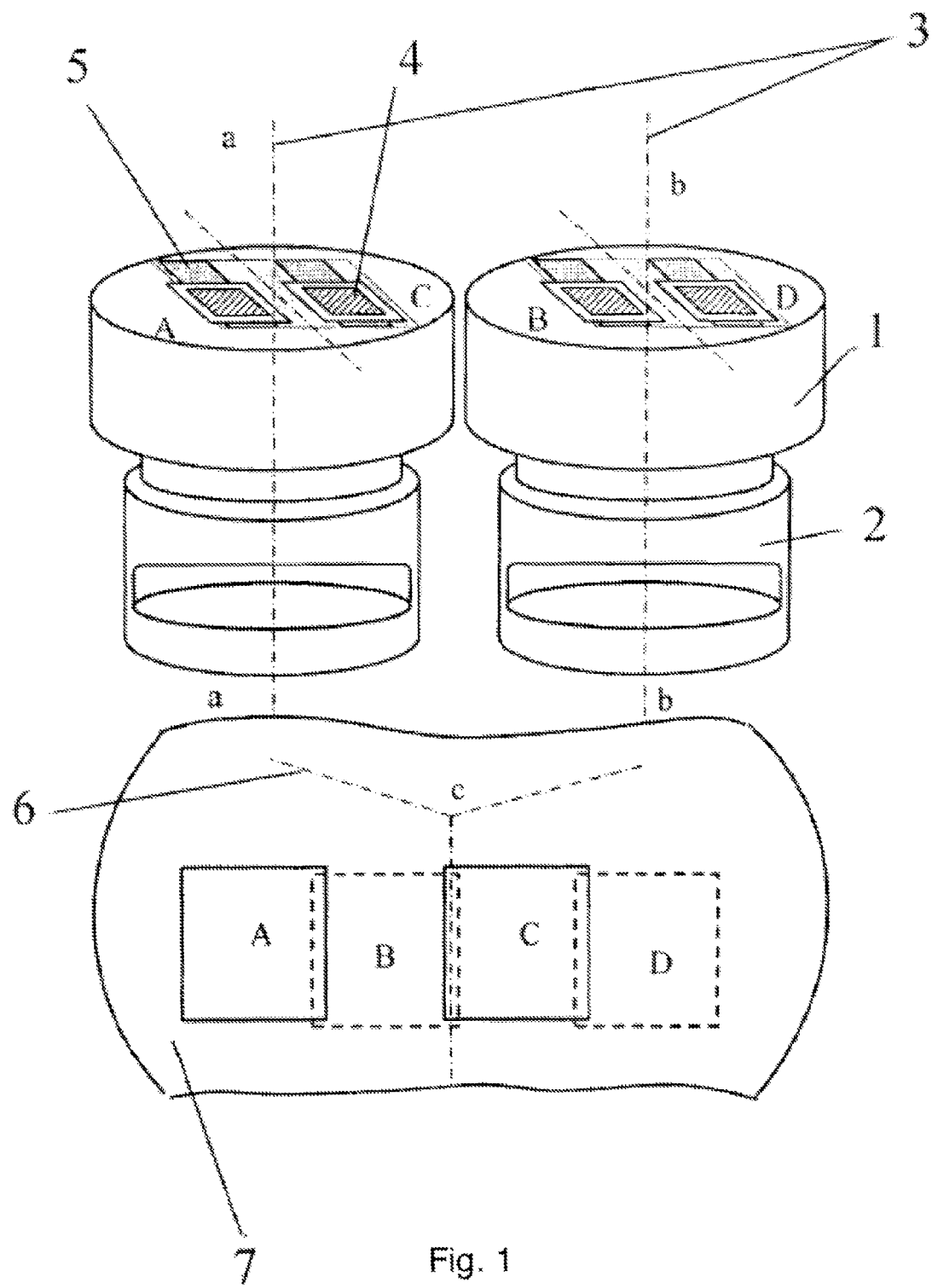
FIG. 1 shows a schematic representation of the first embodiment of an optoelectronic photo sensor consisting of two lenses and four matrices.

An optoelectronic photo sensor comprises holders 1 for lenses 2 with optic axes 3. Digital photosensitive matrices 4 are arranged on cards 5. Axes 3 jointly form equivalent optic axis 6 of the optoelectronic photo sensor. The matrices form a single filed of the image on combined field 7 from individual images ABCD corresponding to the eponymous matrices 4.

Figure 2:
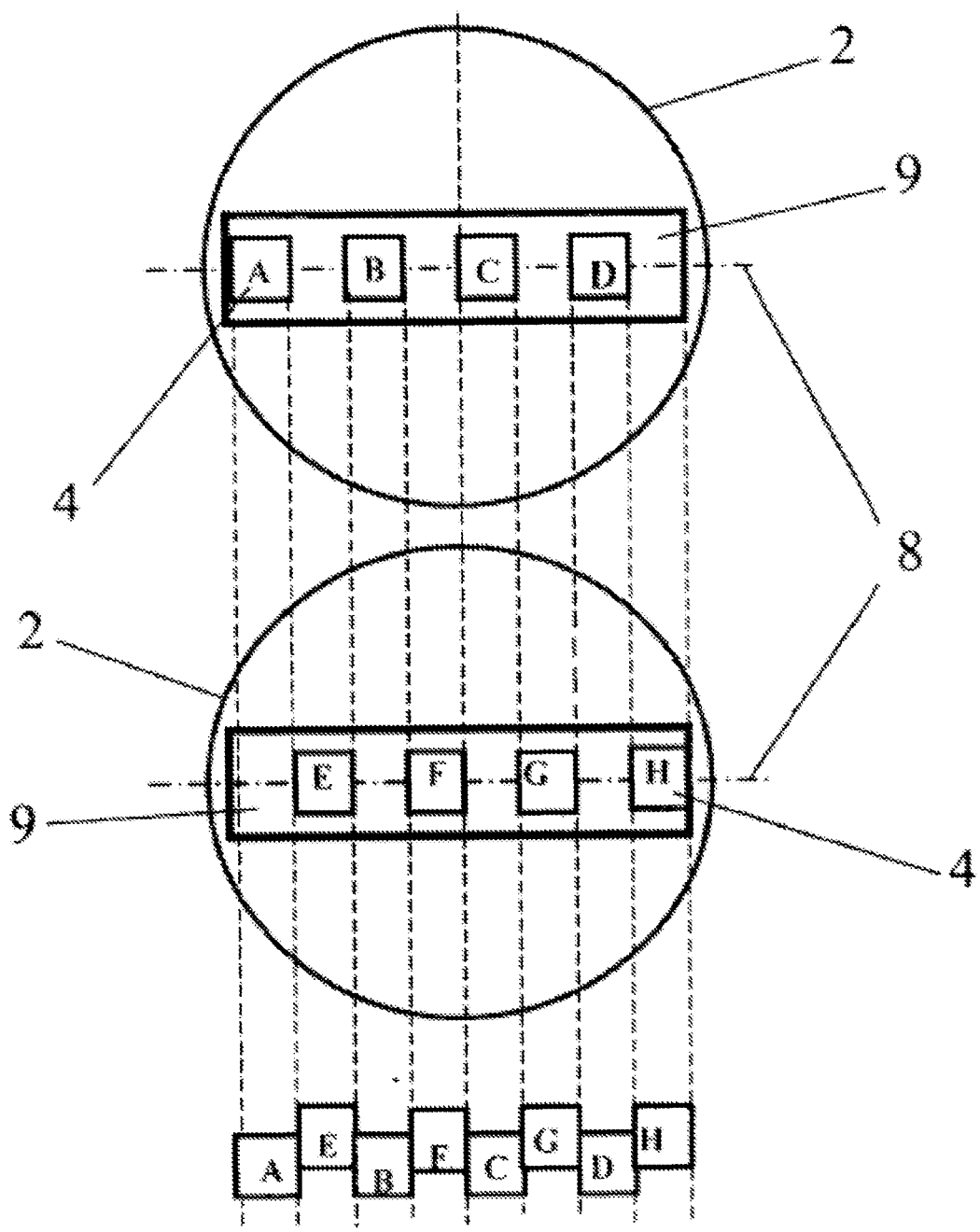
FIG. 2 shows a scheme of eight matrices arranged in two groups of four matrices for two lenses as per the first embodiment.

Matrices 4 form individual groups ABCD and EFGH located on the focal surface of corresponding lenses 2. Groups 9 of matrices 4 are arranged in a row along axis 8 with gaps not exceeding, in size, the product of the number of effective pixels multiplied by the physical size of a pixel of one matrix 4 along the symmetry axis thereof, oriented along the row, multiplied by the number of groups minus one. The groups of matrices are arranged in parallel rows—each on the focal surface of the corresponding lens. Matrices 4 of one group ABCD are displaced with respect to matrices 4 of the other group EFGH along the direction of their row to a distance not exceeding the length of the maximum gap between the matrices in the row. Provided that the surveyed objects are located at a sufficient distance from the lenses, an image of the same scene will be formed on the focal planes of the lenses with an accuracy up to the observation parallaxes (linear, taking into account the distance between the lenses and, in general, angular, accounting for possible non-parallelization of the optic axes) as an overlapping image formed by matrices 4 of the group ABCD of combined field 7. If matrices 4 are arranged in groups of four, the image will consist of mated groups AEBFCGDH (FIG. 2).

In the second and third embodiments, projections of optic axes 3 of lenses 2 onto parallel planes comprising axes 8, form angle 10, expressed in radians, and not exceeding the quotient of the distance between adjacent matrices 4 in a row divided by the product of lenses' number multiplied by their focal distance. In the third embodiment, angle 10 is inversely proportional to the displacement distance of one group of matrices with respect to another, i.e. the third embodiment provides a single continuous view field when one row of matrices is displaced with respect to another to a distance not exceeding the length of the gap between matrices 4 in the row.

The proposed optoelectronic photo sensor is equivalent to the conditional lens with axis (c-c), wherein the view field thereof contains an image, which is practically identical to the image formed in the view fields of lenses (a-a) and (b-b)—i.e., real lenses (a-a) and (b-b) repeat the scene visible in virtual lens (c-c) twice in the image space with the same focal distance and viewing angle as those in lenses 2.

Using at least two lenses instead of one is necessary to ensure a continuous view field when employing real matrices wherein the size of photosensitive area is significantly smaller than their full geometric dimension (due to the crystal case, lead frame and, actually, the outputs). The proposed optoelectronic photo sensor uses a sensor, 6.38×5.26 mm in size, with the diagonal of the reading workspace of 1:2.7 in., which corresponds to the overall view field dimensions of 5.53×4.09 mm, at an aspect ratio 4:3.

Said optoelectronic photo sensor is used in the following way:

As FIG. 1 shows, matrices A and C are fixed in holders 5 in the focal plane of lens (a-a) at some distance from one to another, wherein said distance is shorter than the overall dimensions of the matrix. Matrices B and D B are located in the focal plane of lens (b-b) in similar holders with a gap in-between as well. View fields (a-a), (b-b) and (c-c), disregarding parallaxes, are identical.

Alignment of said arrangement of sensor B in the view field of lens (b-b) satisfies the condition of mating image B zone with image A zone with a small (several dozen points) overlap, which is achieved because the holders of matrices A and B are located in view fields of different lenses and move independently, wherein 20 points with pixel size 3.275 μm make about 0.06-0.07 mm and linear alignment with such movements can be performed by technical means.

Then, by fixing the position of matrices A-B, positions of matrix C are aligned in the focal plane of lens (a-a) to achieve minimum overlapping with matrix B along the adjacent side. Then, similar alignment is performed for the position of matrix sensor D with respect to focal plane (b-b). When a satisfactory result is achieved, positions of holders 5 of matrices 4 are mechanically fixed.

All aforementioned operations are performed under visual control by observing view field (c-c), which jointly displays the data received from all matrices (optic sensors). The proposed device is technically feasible as long as the size of the matrix's visible area exceeds the size of the adjacent matrix frames and holders 5, at least in the direction of assembling.

Optic characteristics of the lenses ensure a balanced size of the matrix sensor and optic space resolution that is sufficient for placing four matrices 4 under the lens onto unified holders 5. Respectively, the optoelectronic photo sensor of such design will have a view field equivalent to view field 8 of adjacent matrices.

In the second embodiment, adjacent rows 9 of matrices may not be displaced with respect to each other, i.e. groups of matrices 4 are arranged in the same way on all lenses 2. However, lenses 2 are tilted with respect to each other along axes 8. Axes 8 are intercrossed and lie in parallel planes. Projections of optic axes of lenses to these planes form angle 10, expressed in radians, that does not exceed the quotient of the distance between adjacent matrices 4 in the row divided by the product of lenses' number multiplied by their focal distance.

Figure 3:
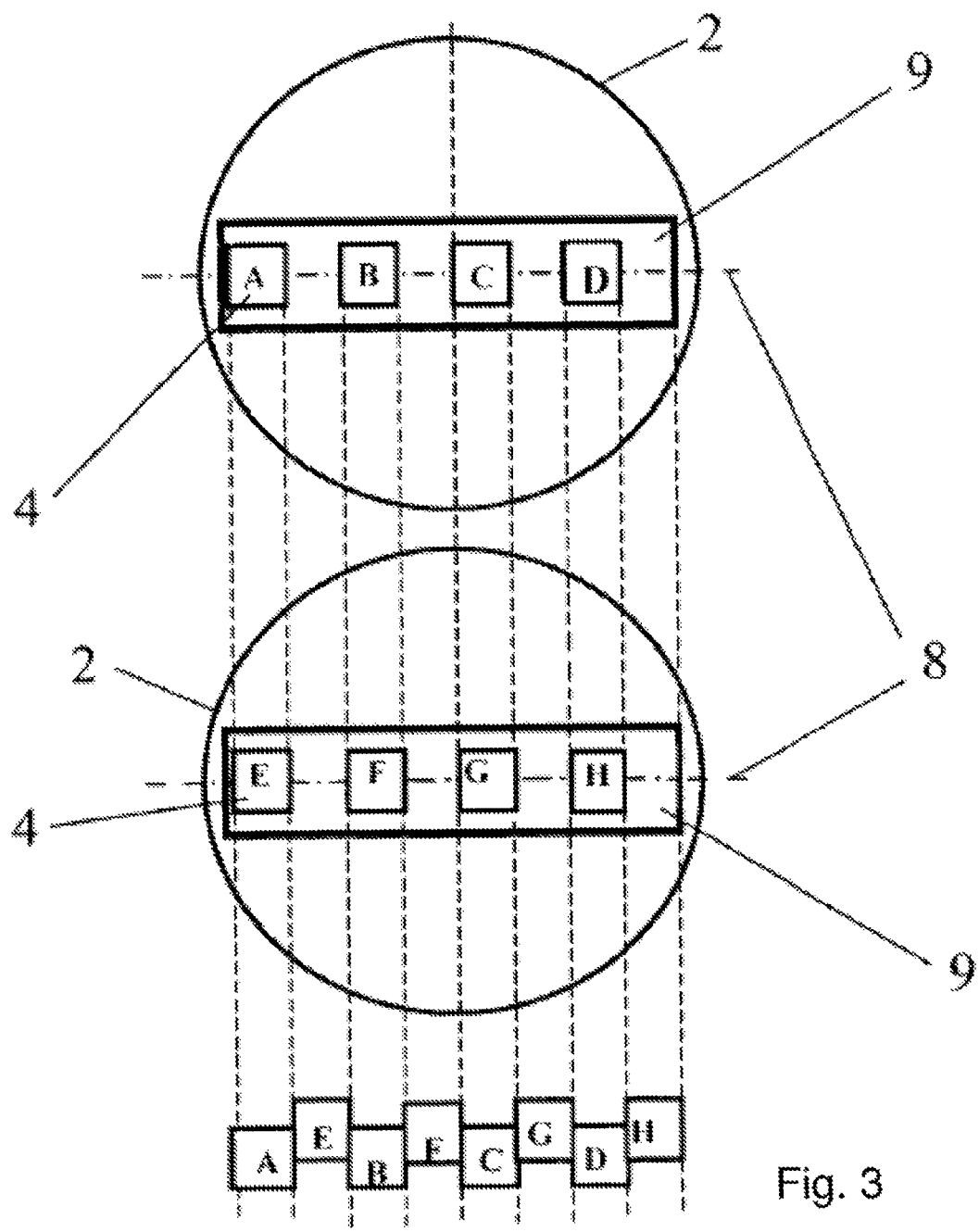
FIG. 3 shows a scheme of matrices arranged on two lenses as per the second embodiment.

Similar to the first embodiment, matrices 4 form separate groups ABCD and EFGH located on the focal plane of corresponding lens 2. Groups 9 of matrices 4 are arranged in a row along axis 8 with gaps in between. Groups of matrices are arranged in parallel rows—each on the focal surface of the corresponding lens. Provided that there is a specified angle between optic axes of the lenses, in the focal planes thereof there will be formed an image of the same scene as an overlapping image formed by matrices 4 of group ABCD of combined field 7. If matrices 4 are arranged in groups of four, the image will consist of mated groups AEBFCGDH (FIG. 3).

Figure 4:
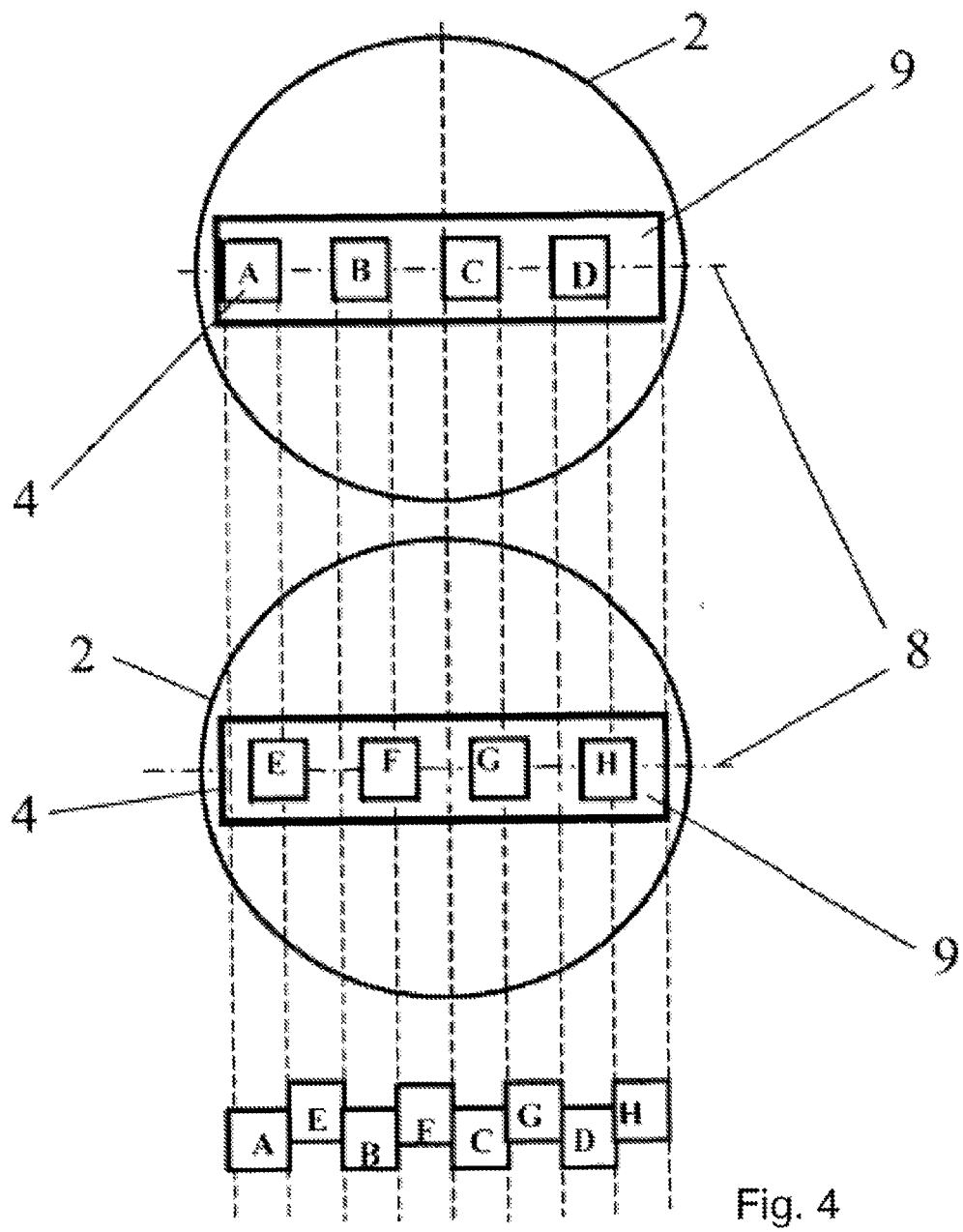
FIG. 4 shows a scheme of matrices arranged on two lenses as per the third embodiment.
Figure 5:
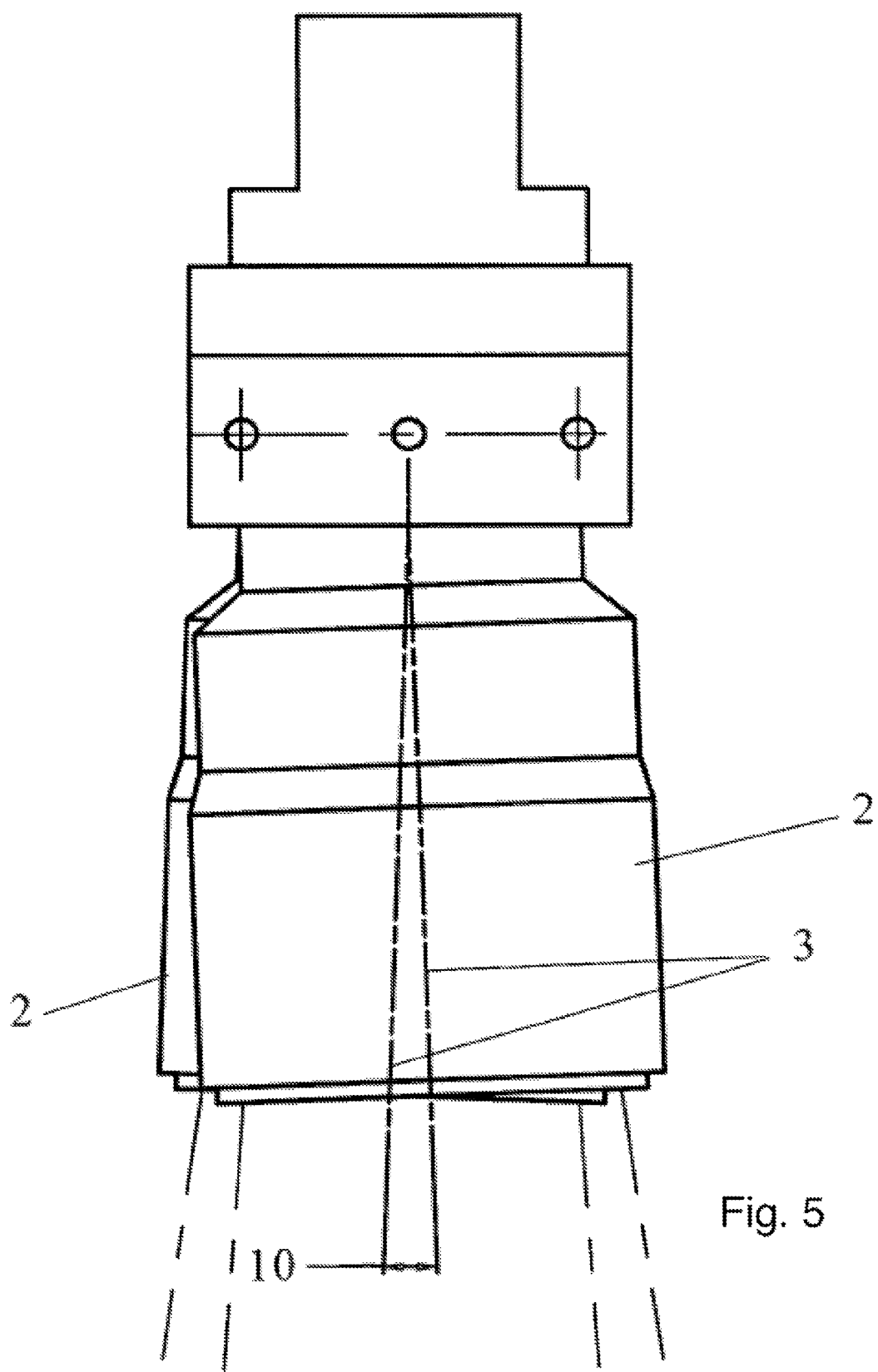
FIG. 5 shows an arrangement of lenses of optic axes for the second and third embodiments.

The third embodiment reflects the intermediate position of matrices and angles between optic axes of lenses, when angle 10 is inversely proportional to the displacement distance of one group of matrices with respect to another (FIG. 4).

The proposed design of optoelectronic photo sensor provides one single continuous view field of the surface surveyed from a plurality of individual lenses and a plurality of individual matrices. Said design is either impossible to create with a single, however, large lens and a single large matrix, or, if created, would be unreasonably expensive and have extremely large dimensions and weight.

What is claimed:

1. An optoelectronic photo sensor comprising an optic system and an electronic photosensitive device located on a focal surface thereof, wherein the optic system comprises at least two lenses, while the electronic photosensitive device comprises separate groups of identical digital photosensitive matrices corresponding to the number of lenses, wherein the total number of all matrices is no less than the number of lenses, wherein the matrices of each group are arranged in a row with gaps in between not exceeding, in size, the product of the number of effective pixels multiplied by a physical pixel size in one matrix along a symmetry axis, oriented along the row, multiplied by the number of groups minus one; wherein the groups of matrices are arranged in parallel rows with each on the focal surface of the corresponding lens in such a way that the matrices of one group are displaced with respect to the matrices of another group along a direction of their row to a distance not exceeding a length of a maximum gap between matrices in the row.

2. An optoelectronic photo sensor, comprising an optic system and an electronic photosensitive device located on a focal surface thereof, wherein the optic system comprises at least two lenses, while the electronic photosensitive device comprises separate groups of identical digital photosensitive matrices corresponding to the number of lenses, wherein the total number of all matrices is no less than the number of lenses, wherein the matrices of each group are arranged on the focal surface of the corresponding lens in a row with gaps along one axis comprising eponymous symmetry axes of the matrices; wherein the axes of the row of matrices in different groups are located in parallel planes whereupon projections of optic axes of the lenses form an angle expressed in radians, and not exceeding the quotient of the distance between adjacent matrices in the row divided by the product of lenses' number multiplied by their focal distance.

3. An optoelectronic photo sensor, comprising an optic system and an electronic photosensitive device located on a focal surface thereof, wherein the optic system comprises at least two lenses, while the electronic photosensitive device comprises separate groups of identical digital photosensitive matrices corresponding to the number of lenses, wherein the total number of all matrices is no less than the number of lenses, wherein the matrices of each group are arranged on the focal surface of the corresponding lens in a row with gaps along one axis, comprising eponymous symmetry axes of the matrices; wherein the size of the gaps in between said matrices does not exceed the product of the number of effective pixels multiplied by the physical pixel size in one matrix along the symmetry axis, oriented along the row, multiplied by the number of groups minus one; wherein the groups of matrices are arranged in parallel rows so that the matrices of one group are displaced with respect to the matrices of the other group along a direction of their row to a distance not exceeding a length of the maximum gap between matrices in the row, while the axes of the rows of matrices of different groups are located in parallel planes, whereupon projections of optic axes of the lenses form an angle, which size is inversely proportional to the size of displacement between the groups of matrices with respect to each other, said angle is expressed in radians and does not exceed the quotient of the distance between adjacent matrices in the row divided by the product of the number of lenses multiplied by their focal distance.

* * * * *